United States Patent
Lin et al.

(10) Patent No.: US 10,574,218 B2
(45) Date of Patent: Feb. 25, 2020

(54) DIGITAL GLITCH FILTER

(71) Applicant: NXP USA, INC., Austin, TX (US)

(72) Inventors: Zhixiong Lin, Suzhou (CN); Mingqin Xie, Suzhou (CN); Yong Zhu, Tianjin (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/237,712

(22) Filed: Jan. 1, 2019

(65) Prior Publication Data
US 2019/0379368 A1    Dec. 12, 2019

(30) Foreign Application Priority Data
Jun. 8, 2018    (CN) .......................... 2018 1 0593097

(51) Int. Cl.
*H03K 5/135*    (2006.01)
*H03K 5/1252*    (2006.01)

(52) U.S. Cl.
CPC ........... *H03K 5/1252* (2013.01); *H03K 5/135* (2013.01)

(58) Field of Classification Search
CPC ........ H03K 21/10; H03K 23/50; H03K 23/58; H03K 21/023; H03K 21/38; H03K 23/548
See application file for complete search history.

(56) References Cited

U.S. PATENT DOCUMENTS

| | | | |
|---|---|---|---|
| 5,185,537 A | 2/1993 | Creedon | |
| 5,198,710 A | 3/1993 | Houston | |
| 5,289,060 A | 2/1994 | Elnashar | |
| 6,535,057 B2 | 3/2003 | Chakravarthy | |
| 6,894,540 B1 | 5/2005 | Ali et al. | |
| 8,558,579 B2 | 10/2013 | Zhang | |
| 8,913,441 B2 * | 12/2014 | Minz | H03K 5/1252 365/189.05 |
| 2014/0118033 A1 * | 5/2014 | Anker | G06F 1/04 327/142 |

* cited by examiner

*Primary Examiner* — John W Poos

(57) ABSTRACT

A digital glitch filter for filtering glitches in an input signal includes a first flip-flop for generating a filtered output signal, and a self-oscillating circuit for generating a self-oscillating clock signal. A first logic gate enables the self-oscillating circuit when the filtered output signal is not equal to the input signal. A ripple counter generates a divided clock signal by dividing the self-oscillating clock signal. A counter and comparator counts the divided clock signal to obtain a count number and compares the count number with a predetermined count target. A second flip-flop, which is connected to the counter and comparator, generates a valid signal, which is activate when the count number reaches the count target. The valid signal is input to the first flip-flop such that the filtered output signal toggles when the valid signal is active.

20 Claims, 4 Drawing Sheets

DIGITAL GLITCH FILTER

BACKGROUND

The present invention relates to glitch filters, and, more particularly, to digital glitch filters for filtering glitches in signals.

A glitch is the sporadic and unintended switching of an input signal level to a high or a low state, followed by a return to the initial state. The occurrence of glitches in a digital circuit may lead to malfunctioning of the circuit and cause the circuit to generate a spurious output.

Conventional digital glitch filters need a free running clock, which continuously consumes dynamic power due to the clock generation and propagation. As a result, the conventional glitch filter compromises low power design.

Therefore, it would be advantageous to have a low power glitch filter.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

In an embodiment of the present invention, a digital glitch filter for filtering glitches in an input signal is provided. The digital glitch filter comprises a first flip-flop for generating the filtered output signal, a self-oscillating circuit for generating a self-oscillating clock signal, a first logic gate for enabling the self-oscillating circuit when the filtered output signal is not equal to the input signal, a ripple counter for generating a divided clock signal by dividing the self-oscillating clock signal, a counter and comparator connected to the ripple counter for counting the divided clock signal to obtain a count number and comparing the count number with a predetermined count target, a second flip-flop connected to the counter and comparator for generating a valid signal, where the valid signal is activated when the count number reaches the count target. The valid signal is input to the first flip-flop such that the filtered output signal toggles when the valid signal is activated.

The self-oscillating circuit may include an AND gate and a delay cell for generating the self-oscillating clock signal, and the delay cell may have a configurable length. The self-oscillating circuit has a feedback path, such that the self-oscillating clock signal is inverted and fed-back to an input of the AND gate, and the output of the first logic gate is provided to another input of the AND gate.

The ripple counter is configured to divide the self-oscillating clock signal by $2^N$. The divided clock signal is provided to a clock input of the second flip-flop, the output of the counter and comparator is provided to a data input terminal of the second flip-flop, the output of the first logic gate is provided to a reset terminal of the second flip-flop, and the self-oscillating clock signal is provided to the clock input of the first flip-flop.

The digital glitch filter may further comprise a second logic gate connected between the second and first flip-flops, wherein an output of the second logic gate is provided to a data input terminal of the first flip-flop.

The filtered output signal generated by the first flip-flop and the valid signal generated by the second flip-flop are provided to the input terminals of the second logic gate. In one embodiment, the first and second logic gates are XOR gates.

In another embodiment, the present invention is a digital glitch filter for filtering glitches in an input signal. The digital glitch filter includes a first flip-flop for generating a filtered output signal, a self-oscillating circuit for generating a self-oscillating clock signal, and a first logic gate for enabling the self-oscillating circuit when the filtered output signal is not equal to the input signal, and disabling the self-oscillating circuit when the filtered output signal is equal to the input signal. A counter and comparator counts pulses of the self-oscillating clock signal for a predetermined time to obtain a count value, and compares the count value with a predetermined count target. A second flip-flop is connected to the counter and comparator for generating a valid signal. The valid signal is activated when the count value equals the count target. A second logic gate has an output connected to a data input of the first flip-flop, a first input that receives the valid signal, and a second input that receives the filtered output signal, such that the filtered output signal is toggled when the valid signal is active. The self-oscillating clock signal is used to clock the first and second flip-flops.

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
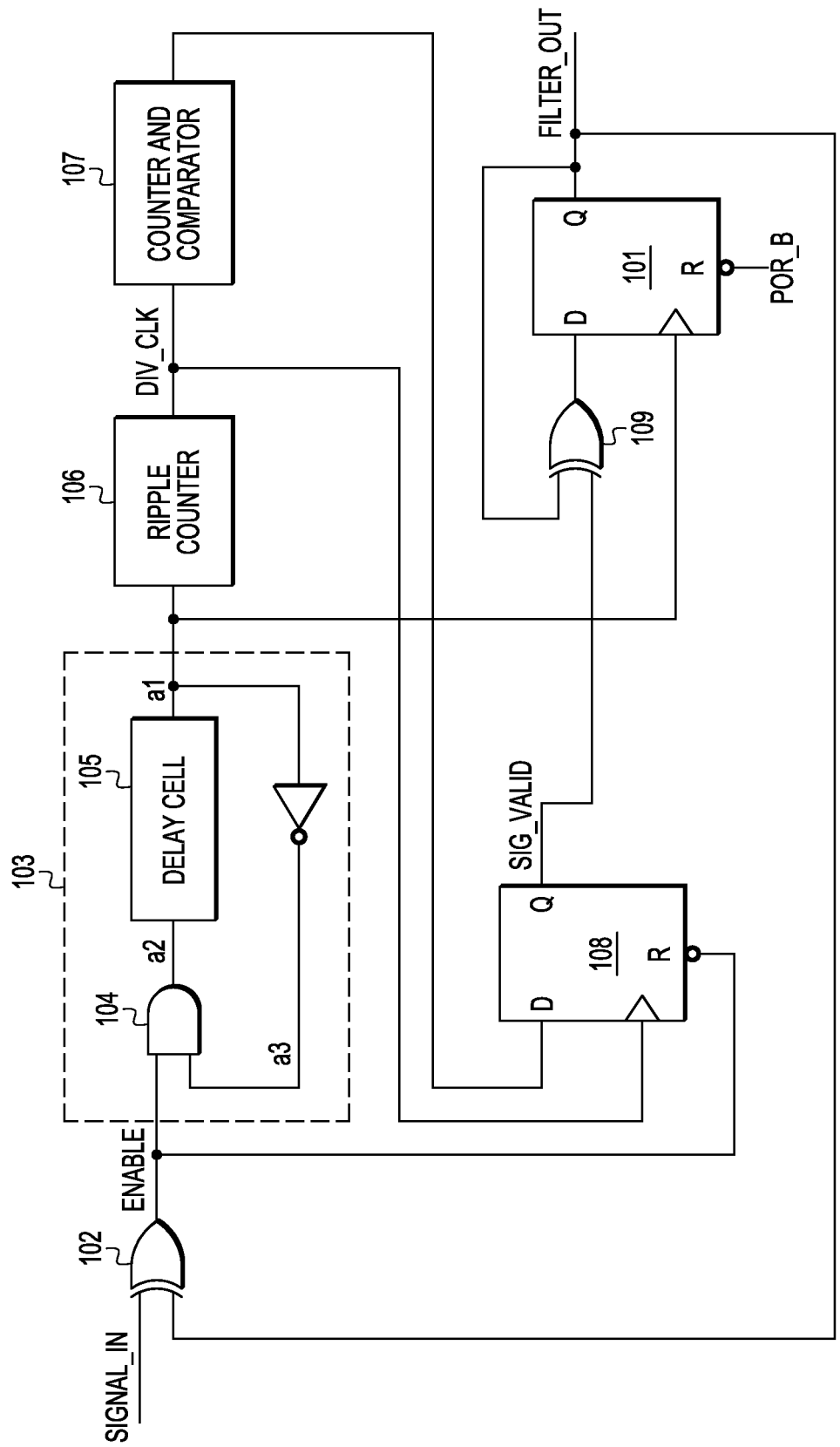
FIG. 1 is a schematic block diagram of a digital glitch filter in accordance with an exemplary embodiment of the present application.

Referring now to the FIG. 1, a schematic diagram of a digital glitch filter 100 in accordance with an embodiment of the present invention is shown. The glitch filter 100 receives an input signal and generates a filtered output signal. The digital glitch filter 100 includes a first flip-flop 101, a first XOR gate 102, a self-oscillating circuit 103, an AND gate 104, a delay cell 105, a ripple counter 106, a counter and comparator 107, a second flip-flop 108, and a second XOR gate 109.

The first flip-flop 101 is configured to generate the filtered output signal. The first flip-flop 101 has a D input connected to an output of the first XOR gate 102. The input signal and the filtered output signal are provided to the input terminals of the first XOR gate 102. When the input signal is not equal to the filtered output signal, the XOR gate 102 outputs logic 1, which enables the self-oscillating circuit 103. When the input signal is equal to the filtered output signal, the XOR gate 102 outputs logic 0, which disables the self-oscillating circuit 103.

The self-oscillating circuit 103 is configured to generate a first self-oscillating signal a1. In one embodiment, the self-oscillating circuit 103 includes the AND gate 104 and the delay cell 105. The AND gate 104 is connected to the first XOR gate 102. More particularly, the output of XOR gate 102 is provided to one of the input terminals of the AND gate 104. The first self-oscillating signal a1 generated by the delay cell 105 is inverted and provided to another input terminal of the AND gate 104. The AND gate 104 outputs a second self-oscillating signal a2, which is provided to the delay cell 105 for generating the first self-oscillating signal a1.

The ripple counter 106 is connected to the self-oscillating circuit 103, and the first self-oscillating signal a1 is provided to the ripple counter 106. The ripple counter 106 is configurable to divide the first self-oscillating signal a1 by $2^N$ and then output a divided clock signal (div_clk). The ripple counter 106 provides a power efficient way to convert the first self-oscillating signal a1 to a slower signal.

The output terminal of the ripple counter 106 is connected to an input terminal of the counter and comparator 107. The counter and comparator 107 counts the divided clock signal and compares the count number with a predetermined count target, where the count target is configurable. For example, in one embodiment, the count target is 3. In other embodiments, the count target may be any number required. If an input signal changes state before the count number reaches the count target, then the input signal is considered to be a glitch and is filtered. In this way, the digital glitch filter achieves high efficiency and high accuracy.

When the input signal remains the same state until the count number reaches the count target without the input signal changing state, then the input signal is considered as a valid signal and the valid signal output by the second flip-flop 108 is activated. The output terminal of the counter and comparator 107 is connected to the data input terminal of the second flip-flop 108. The divided clock signal generated by the ripple counter 106 is connected to the clock input terminal of the second flip-flop 108. The output of the XOR gate 102 is connected to the reset terminal of the second flip-flop 108. When the first XOR gate 102 goes high logic 1, the second flip-flop 108 is reset. The second flip-flop 108 outputs a valid signal when the input signal remains the same state until the count number reaches the count target. That is, the valid signal is generated when the input signal remains the same state for a predetermined time period specified by the counter and comparator 107.

The valid signal toggles the filtered output signal when the valid signal is equal to logic 1. In one embodiment, the valid signal output by the second flip-flop 108 is provided to one of the input terminals of the second XOR gate 109. Another input terminal of the second XOR gate 109 is connected to the output of the first flip-flop 101 and receives the filtered output signal. Then the output of the second XOR gate 109 is provided to the data input terminal of the first flip-flop 101. The clock input terminal of the first flip-flop 101 is connected to the output of the delay cell 105. The reset terminal of the first flip-flop 101 receives a POR reset(por_b) signal. In one embodiment, the POR reset signal is between 0~3.3V. The clock input terminal of the first flip-flop 101 alternatively may be connected to the output terminal of the AND gate 104, in which case, if the valid signal switches to a high state, the filtered output signal toggles and is equal to the input signal. In the embodiment shown, the second XOR gate 109 is used to toggle the filtered output signal when the valid signal switches to a high state.

If the filtered output signal is originally equal to logic 0, the XOR gate 109 outputs logic 1 when the valid signal is equal to logic 1. Then the filtered output signal toggles and switches to logic 1. If the filtered output signal is originally equal to logic 1, the XOR gate 109 outputs logic 0 when the valid signal is equal to logic 1. The filtered output signal switches to logic 0. In this way, the filtered output signal toggles only if the valid signal is equal to logic 1. This is a simple way to toggle the filtered output signal. In other embodiments, other circuits can be used to toggle the filtered output signal when the valid signal is equal to logic 1.

When the filtered output signal is toggled, the signal is equal to the input signal. Then the XOR gate 102 outputs a logic 0. In this way, the XOR gate 102 disables the self-oscillating circuit. In the meantime, the second flip-flop 108 is reset by the output of the XOR gate 102 and the valid signal is reset to logic 0. When the XOR gate 102 outputs logic 0, it will also reset the ripple counter 106, and the counter and comparator 107.

The delay cell 105, ripple counter 106, and the counter and comparator 107 are configurable, so the width of the filtered glitch can be varied from about 30 ps($10^{-12}$ s) to several us($10^{-6}$ s) or ms ($10^{-3}$ s) period range.

Figure 2:
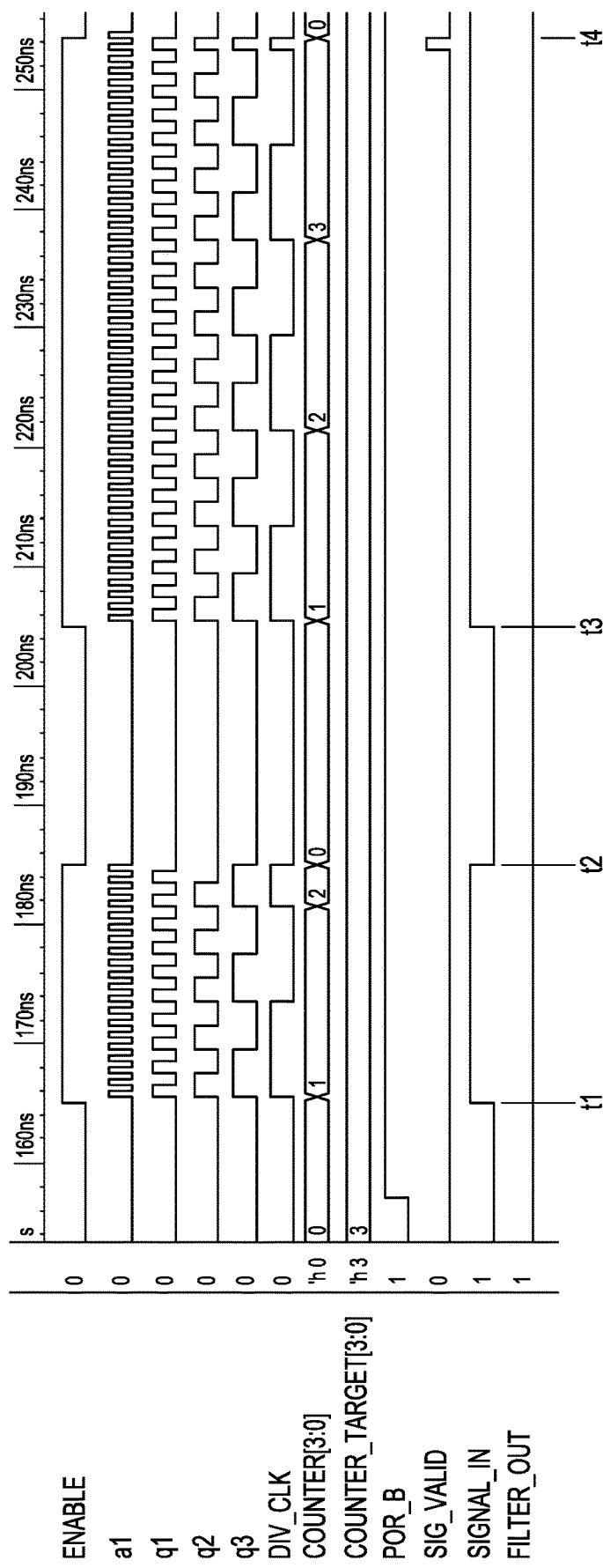
FIG. 2 illustrates a timing diagram for the circuit of FIG. 1.

Referring now to FIG. 2, a timing diagram 200 corresponding to the digital glitch filter 100 of FIG. 1, in accordance with an embodiment of the present invention, is shown. The timing diagram 200 includes waveforms corresponding to the input signal (signal_in), the enable signal (enable), the first self-oscillating signal (a1), the signals generated by the ripple counter (q1, q2, q3 and div_clk), the counter, counter target, the POR (power on reset) signal (por_b), the valid signal (signal_valid), and the filtered output signal (filter_out). The operation of the digital glitch filter 100 will now be explained in conjunction with the timing diagram 200 in detail.

At time t1, the input signal switches to a high state. The filter output signal generated by the first flip-flop 101 is still at a low state, so the filter output signal is not equal to the input signal. The input signal and the filtered output signal are provided to the input terminals of the XOR gate 102, so the enable signal generated by the XOR gate 102 switches to a high state, which enables the self-oscillating circuit 103. The first self-oscillating signal (a1) then switches to a high state. As the first-oscillating signal (a1) is provided to the ripple counter 106, the ripple counter 106 divides the first-oscillating signal (a1) by $2^N$. As a result, the frequency of q1 is half of the frequency of the first-oscillating signal (a1). The frequency of q2 is a quarter of the first-oscillating signal (a1), and the frequency of q3 is one-eighth of the frequency of the first-oscillating signal (a1).

The frequency of the divided clock signal (div_clk) is 1/16 of the first-oscillating signal (a1). The ripple counter 106 is configurable. In one embodiment, the ripple counter is a 5-bit counter. In other embodiments, the ripple counter can be a 4-bit counter or any-bit counter depending on design criteria, so at time t1, the signal div_clk switches to a high state. Then the counter and comparator 107 counts the divided clock signal (div_clk) and compares count number of the divided clock signal to a target, which is configurable.

For example, in one embodiment, the target is 3. In other embodiments, the target may be set to other values.

At time t2, the input signal switches to a low state and the count number is 2, in this example, the count target is set as 3. The input signal thus is considered to be a glitch and the valid signal stays at a low state. Also, since the input signal switches is low, then the input signal is equal to the filtered output signal, which also is low. The enable signal switches to a low state, which disables the self-oscillating circuit 103, the ripple counter 106, and the counter and comparator 107, so both of the first self-oscillating signal (a1) and the divided clock signal switch to a low state.

At time t3, the input signal switches to a high state. Thus, once again, the self-oscillating circuit 103, the ripple counter 106, and the counter and comparator 107 are enabled.

At time t4, the counter and comparator 107 counts the divided clock signal and since the count number is 3, the count reaches the count target. The input signal remains high until the count number reaches the count target. Then the input signal is treated as a valid signal, so the valid signal generated by the second flip-flop 108 switches to a high state, which causes the filtered output signal to toggle. Thus, the filtered output signal switches to a high state. At the same time, the input signal is at a high state, so the filtered output signal equals the input signal. The enable signal then switches to a low state, which disables the self-oscillating circuit 103. The first self-oscillating signal (a1) and the divided clock signal switch to a low state. The second flip-flop 108 is reset and the valid signal switches to a low state.

Figure 3:
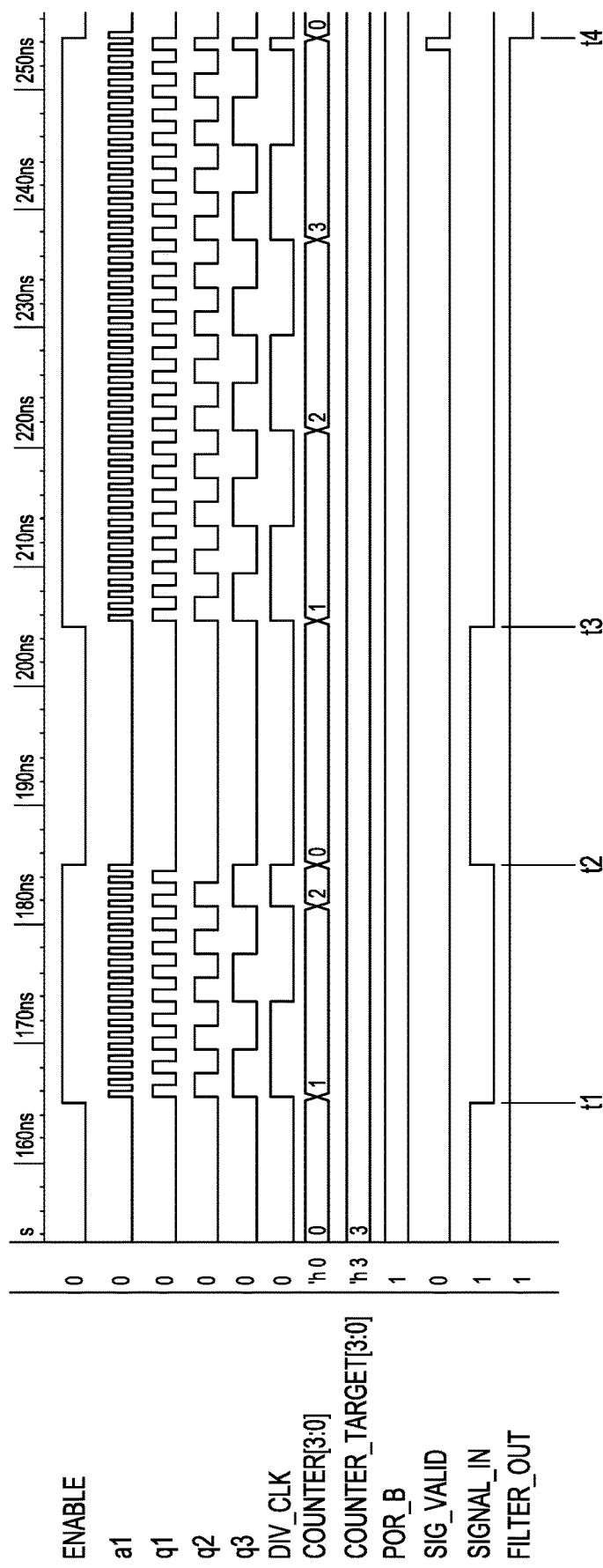
FIG. 3 illustrates another timing diagram for the circuit of FIG. 1.

Referring now to FIG. 3, a timing diagram 300 corresponding to the digital glitch filter 100 of FIG. 1, in accordance with another embodiment of the present invention, is shown. One difference between the diagram 300 and the diagram 200 is that the input signal is opposite in value. The operation of the digital flitch filter 100 will now be explained in detail in conjunction with the timing diagram 300.

At time t1, the input signal switches from a high state to a low state. The filtered output signal is at a high state, so the enable signal switches to a high state, which enables the self-oscillating circuit 103.

At time t2, the input signal switches to a high state. The filtered output signal stays at a high state, so the input signal equals the filtered output signal. The enable signal switches to a low state, which disables the self-oscillating circuit 103.

At time t3, the input signal switches to a low state and since the filtered output signal is high, the enable signal switches to a high state. The divided clock signal switches to a high state and the counter and comparator 107 counts the divided clock signal and compares the count number to the count target.

At time t4, the input signal remains a state until the count number of the divided clock signal reaches the count target. The input signal is treated as a valid signal. Then the valid signal generated by the second flip-flop 108 switches to a high state, so the filtered output signal toggles. Then the filtered output signal is at a low state and equal to the input signal. The enable signal switches to a low state and disables the self-oscillating circuit 103. The first self-oscillating signal (a1) and the divided clock signal switch to a low state and the valid signal generated by the second flip-flop 108 switches to a low state.

As described above, the self-oscillating circuit 103 does not need to run continuously, but is only enabled when the input signal is not equal to the filtered output signal, and it is disabled when the input signal is equal to the filtered output signal.

Figure 4:
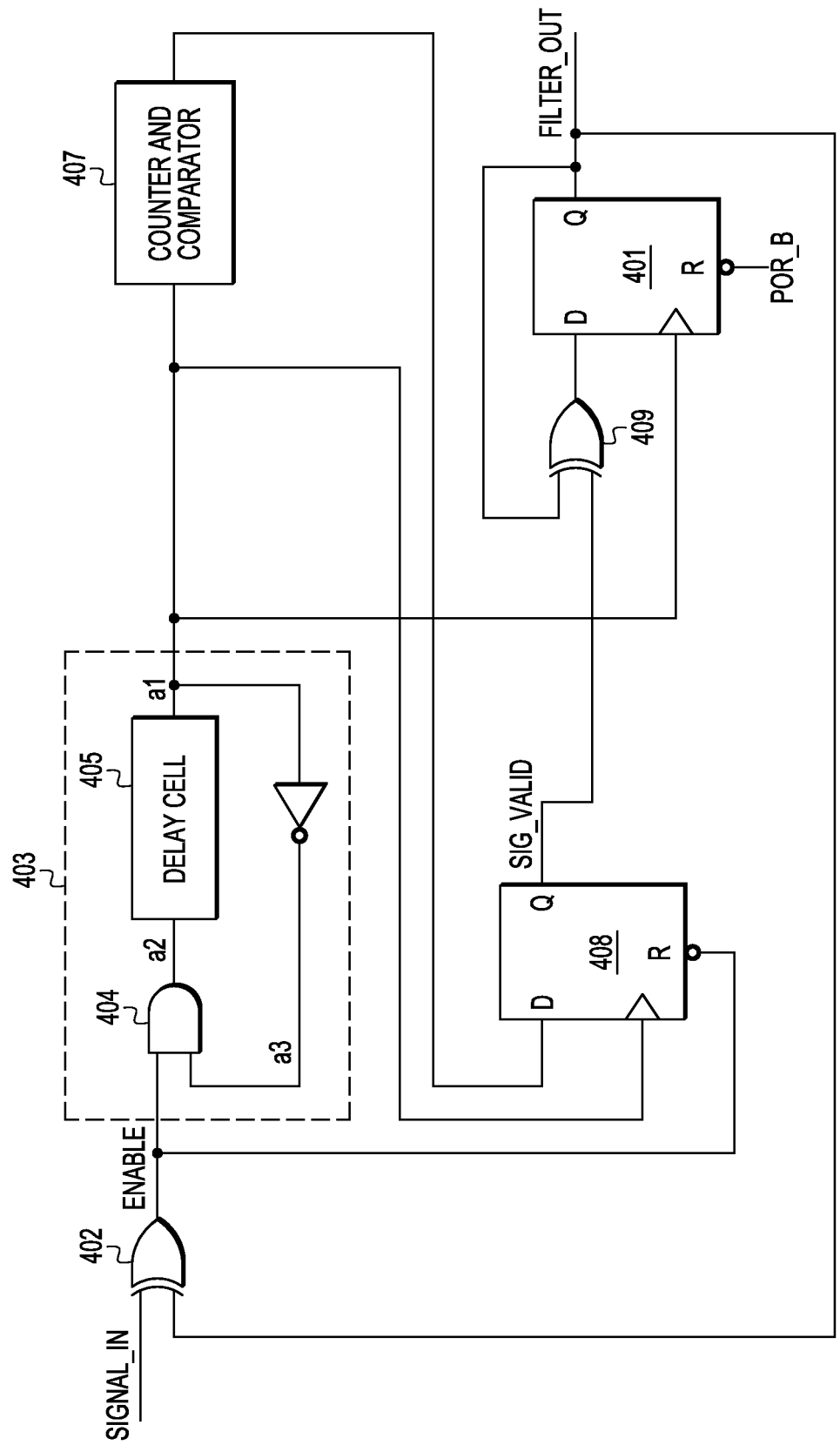
FIG. 4 is a schematic block diagram of a digital glitch filter in accordance with another exemplary embodiment of the present application.

Referring now to the FIG. 4, a schematic diagram of a digital glitch filter 400 in accordance with another embodiment of the present invention is shown. The digital glitch filter 400 includes a first flip-flop 401, a first XOR gate 402, a self-oscillating circuit 403, an AND gate 404, a delay cell 405, a counter and comparator 407, a second flip-flop 408, and a second XOR gate 409.

The first flip-flop 401 is configured to generate the filtered output signal. The output terminal of the first flip-flop 401 is connected to one of the inputs of the first XOR gate 402. The input signal is provided to the other input terminal of the first XOR gate 402. When the input signal is not equal to the filtered output signal, the XOR gate 402 outputs logic 1, which enables the self-oscillating circuit 403. When the input signal is equal to the filtered output signal, the XOR gate 402 outputs logic 0, which disables the self-oscillating circuit 403.

The self-oscillating circuit 403 is configured to generate a first self-oscillating signal (a1). The self-oscillating circuit 403 may include the AND gate 404 and the delay cell 405. The AND gate 404 has one input connected to the output of the XOR gate 402, and anther input that receives a first self-oscillating signal generated by the delay cell 105 and inverted with an inverter. The AND gate 404 outputs a second self-oscillating signal (a2) and the second self-oscillating signal is input to the delay cell 405 for generating the first self-oscillating signal.

The counter and comparator 407 is connected to the self-oscillating circuit 403 and receives as an input the first self-oscillating signal (a1). The counter and comparator 407 counts the first self-oscillating signal (a1) and compare the count number to the count target, which is configurable. If the input signal changes state before the count number reaches the count target, then the input signal is considered to be a glitch and will be filtered.

When the input signal remains the same state until the count number reaches the count target, then the input signal is considered as a valid signal and the valid signal by the second flip-flop 408 will be activated. The output terminal of the counter and comparator 407 is connected to the data input terminal of the second flip-flop 408. The divided clock signal, which in this embodiment is generated by the self-oscillating circuit 403 is connected to the clock input terminal of the second flip-flop 408. The output of the first XOR gate 402 is connected to the reset terminal of the second flip-flop 408. When the first XOR gate 402 generates logic 1 (when the input signal is not equal to the filtered output signal), the second flip-flop 408 is reset. The valid signal output by the second flip-flop 408 is activated when the input signal remains the same state until the count number reaches the count target.

The valid signal output by the second flip-flop 408 is provided to one of the input terminals of the second XOR gate 409, and the output of the first flip-flop 401, which is the filtered output signal, is provided to the other input of the second XOR gate 409. The output of the second XOR gate 109 is provided to the data input terminal of the first flip-flop 401. The clock input terminal of the first flip-flop 401 is connected to the output of the delay cell 405, and a reset terminal of the first flip-flop 401 receive a POR (por_b) signal. In one embodiment, the POR signal is between 0~3.3V. Alternatively, the clock input terminal of the first flip-flop 401 also could be connected to the output terminal of the AND gate 404. As a result, if the valid signal is equal to the filtered output signal, then the filtered output signal will toggle and the XOR gate 402 will output a logic 0. In this manner, the first XOR gate 402 will disable the self-oscillating circuit 403.

A digital glitch filter has been described that is not always "on", such that the digital glitch filter of the present invention does not continuously consume power and therefore is advantageous for low-power designs.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A digital glitch filter for filtering glitches in an input signal, comprising:
   a first flip-flop for generating a filtered output signal; a self-oscillating circuit for generating a self-oscillating clock signal when the filtered output signal is not equal to the input signal;
   a first logic gate for enabling the self-oscillating circuit when the filtered output signal is not equal to the input signal, and disabling the self-oscillating circuit when the filtered output signal is equal to the input signal;
   a ripple counter, connected to the self-oscillating circuit, for generating a divided clock signal by dividing the self-oscillating clock signal;
   a counter and comparator connected to the ripple counter for counting the divided clock signal to obtain a count number and comparing the count number with a predetermined count target; and
   a second flip-flop connected to the counter and comparator for generating a valid signal, wherein the valid signal is activated when the count number reaches the count target, and wherein the valid signal is input to the first flip-flop such that the filtered output signal toggles when the valid signal is activated, and
   wherein the self-oscillating circuit further includes:
      an AND gate connected between the first logic gate and the delay cell, and
      a feedback path, wherein the self-oscillating clock signal is inverted and fed-back to an input terminal of the AND gate, and the output of the first logic gate is provided to another input terminal of the AND gate.

2. The digital glitch filter of claim 1, wherein the self-oscillating circuit includes a delay cell for generating the self-oscillating clock signal.

3. The glitch filter of claim 2, wherein the delay cell has a configurable length.

4. The digital glitch filter of claim 1, wherein the ripple counter is configured to divide the self-oscillating clock signal by 2N.

5. A digital glitch filter for filtering glitches in an input signal, comprising:
   a first flip-flop for generating a filtered output signal; a self-oscillating circuit for generating a self-oscillating clock signal when the filtered output signal is not equal to the input signal;
   a first logic gate for enabling the self-oscillating circuit when the filtered output signal is not equal to the input signal, and disabling the self-oscillating circuit when the filtered output signal is equal to the input signal;
   a ripple counter, connected to the self-oscillating circuit, for generating a divided clock signal by dividing the self-oscillating clock signal;
   a counter and comparator connected to the ripple counter for counting the divided clock signal to obtain a count number and comparing the count number with a predetermined count target; and
   a second flip-flop connected to the counter and comparator for generating a valid signal, wherein the valid signal is activated when the count number reaches the count target, and
   wherein:
      the valid signal is input to the first flip-flop such that the filtered output signal toggles when the valid signal is activated,
      the divided clock signal is provided to a clock input terminal of the second flip-flop,
      the output of the counter and comparator is provided to a data input terminal of the second flip-flop,
      the output of the first logic gate is provided to a reset terminal of the second flip-flop, and
      the self-oscillating clock signal is provided to the clock input terminal of the first flip-flop.

6. The digital glitch filter of claim 5, wherein the self-oscillating circuit includes a delay cell for generating the self-oscillating clock signal.

7. The glitch filter of claim 6, wherein the delay cell has a configurable length.

8. The digital glitch filter of claim 5, wherein the ripple counter is configured to divide the self-oscillating clock signal by 2N.

9. A digital glitch filter for filtering glitches in an input signal, comprising:

a first flip-flop for generating a filtered output signal; a self-oscillating circuit for generating a self-oscillating clock signal when the filtered output signal is not equal to the input signal;

a first logic gate for enabling the self-oscillating circuit when the filtered output signal is not equal to the input signal, and disabling the self-oscillating circuit when the filtered output signal is equal to the input signal;

a ripple counter, connected to the self-oscillating circuit, for generating a divided clock signal by dividing the self-oscillating clock signal;

a counter and comparator connected to the ripple counter for counting the divided clock signal to obtain a count number and comparing the count number with a predetermined count target;

a second flip-flop connected to the counter and comparator for generating a valid signal, wherein the valid signal is activated when the count number reaches the count target, and wherein the valid signal is input to the first flip-flop such that the filtered output signal toggles when the valid signal is activated; and a second logic gate connected between the second and first flip-flops, wherein an output of the second logic gate is provided to a data input terminal of the first flip-flop.

10. The digital glitch filter of claim 9, wherein the filtered output signal generated by the first flip-flop and the valid signal generated by the second flip-flop are provided to the input terminals of the second logic gate.

11. The digital glitch filter of claim 10, wherein the second logic gate is a XOR gate.

12. The digital glitch filter of claim 9, wherein the self-oscillating circuit includes a delay cell for generating the self-oscillating clock signal.

13. The glitch filter of claim 12, wherein the delay cell has a configurable length.

14. The digital glitch filter of claim 9, wherein the ripple counter is configured to divide the self-oscillating clock signal by 2N.

15. A digital glitch filter for filtering glitches in an input signal, comprising:

a first flip-flop for generating a filtered output signal; a self-oscillating circuit for generating a self-oscillating clock signal when the filtered output signal is not equal to the input signal;

a first logic gate for enabling the self-oscillating circuit when the filtered output signal is not equal to the input signal, and disabling the self-oscillating circuit when the filtered output signal is equal to the input signal;

a ripple counter, connected to the self-oscillating circuit, for generating a divided clock signal by dividing the self-oscillating clock signal;

a counter and comparator connected to the ripple counter for counting the divided clock signal to obtain a count number and comparing the count number with a predetermined count target; and a second flip-flop connected to the counter and comparator for generating a valid signal, wherein the valid signal is activated when the count number reaches the count target, and wherein the valid signal is input to the first flip-flop such that the filtered output signal toggles when the valid signal is activated, and wherein the first logic gate is a XOR gate.

16. The digital glitch filter of claim 15, wherein the self-oscillating circuit includes a delay cell for generating the self-oscillating clock signal.

17. The glitch filter of claim 16, wherein the delay cell has a configurable length.

18. The digital glitch filter of claim 15, wherein the ripple counter is configured to divide the self-oscillating clock signal by 2N.

19. A digital glitch filter for filtering glitches in an input signal, comprising:

a first flip-flop for generating a filtered output signal; a self-oscillating circuit for generating a self-oscillating clock signal;

a first logic gate for enabling the self-oscillating circuit when the filtered output signal is not equal to the input signal, and disabling the self-oscillating circuit when the filtered output signal is equal to the input signal;

a counter and comparator for counting pulses of the self-oscillating clock signal for a predetermined time to obtain a count value and comparing the count value with a predetermined count target;

a second flip-flop connected to the counter and comparator for generating a valid signal, wherein the valid signal is activated when the count value equals the count target; and a second logic gate having an output connected to a data input of the first flip-flop, a first input that receives the valid signal, and a second input that receives the filtered output signal, such that the filtered output signal is toggled when the valid signal is active.

20. The digital glitch filter of claim 19, wherein the self-oscillating clock signal is used to clock the first and second flip-flops.

* * * * *